United States Patent
Yang (10) Patent No.: US 9,905,593 B2
(45) Date of Patent: Feb. 27, 2018

(54) MASK PLATE AND METHOD FOR MANUFACTURING ARRAY SUBSTRATE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventor: Huaiwei Yang, Beijing (CN)

(73) Assignees: BOE TECHNOLOGY GROUP CO., LTD. (CN); HEFEI BOE OPTOELECTRONICS TECHNOLOGY CO., LTD. (CN)

( * ) Notice: Subject to any disclaimer, the term of this patent is extended or adjusted under 35 U.S.C. 154(b) by 109 days.

(21) Appl. No.: 14/905,706

(22) PCT Filed: Jul. 28, 2015

(86) PCT No.: PCT/CN2015/085322
§ 371 (c)(1),
(2) Date: Jan. 15, 2016

(87) PCT Pub. No.: WO2016/123935
PCT Pub. Date: Aug. 11, 2016

(65) Prior Publication Data
US 2017/0229492 A1 Aug. 10, 2017

(30) Foreign Application Priority Data

Feb. 6, 2015 (CN) .......................... 2015 1 0064583

(51) Int. Cl.
*H01L 27/12* (2006.01)
*G03F 7/20* (2006.01)
*G03F 1/24* (2012.01)

(52) U.S. Cl.
CPC ............ *H01L 27/1288* (2013.01); *G03F 1/24* (2013.01); *G03F 7/2045* (2013.01)

(58) Field of Classification Search
None
See application file for complete search history.

(56) References Cited

U.S. PATENT DOCUMENTS 7,893,440 B2 * 2/2011 Kwon ................ H01L 27/1255
257/40
2010/0055817 A1 3/2010 Song et al.
(Continued)

FOREIGN PATENT DOCUMENTS

CN 201251667 Y 6/2009
CN 101520599 A 9/2009
(Continued)

OTHER PUBLICATIONS

International Search Report and Written Opinion for Application No. PCT/CN2015/085322, dated Oct. 26, 2015, 10 Pages.

*Primary Examiner* — Michelle Mandala
(74) *Attorney, Agent, or Firm* — Brooks Kushman P.C.

(57) ABSTRACT

The present disclosure provides a mask plate, including a first region corresponding to a GOA region of an array substrate and a second region corresponding to a display region of the array substrate. The first region comprises at least one first aperture, the at least one first aperture is used to form a GI via-hole penetrating through a gate insulating layer at the GOA region, and a gate line is exposed through the GI via-hole. The second region comprises at least one second aperture, the at least one second aperture is a half-tone mask aperture and is used to form a VIA via-hole at the display region, and a source/drain metal layer pattern is exposed through the VIA via-hole.

12 Claims, 4 Drawing Sheets

(56) References Cited

U.S. PATENT DOCUMENTS

| | | | | |
|---|---|---|---|---|
| 2012/0190197 A1* | 7/2012 | Hui | ............................ | G03F 1/50 |
| | | | | 438/689 |
| 2015/0093845 A1* | 4/2015 | Ookawara | ............ | H01L 51/5221 |
| | | | | 438/34 |
| 2015/0155305 A1* | 6/2015 | Wu | ........................ | H01L 27/124 |
| | | | | 257/72 |
| 2016/0013210 A1 | 1/2016 | Li et al. | | |
| 2016/0049500 A1* | 2/2016 | Yu | ........................ | H01L 21/0272 |
| | | | | 438/104 |
| 2017/0229492 A1 | 8/2017 | Yang | | |

FOREIGN PATENT DOCUMENTS

| | | |
|---|---|---|
| CN | 102983135 A | 3/2013 |
| CN | 103489877 A | 1/2014 |
| CN | 103762199 A | 4/2014 |
| CN | 104635416 A | 5/2015 |

* cited by examiner

MASK PLATE AND METHOD FOR MANUFACTURING ARRAY SUBSTRATE

CROSS-REFERENCE TO RELATED APPLICATION

This application is the U.S. national phase of PCT Application No. PCT/CN2015/085322 filed on Jul. 28, 2015, which claims a priority to the Chinese Patent Application No. 201510064583.9 filed on Feb. 6, 2015, the disclosures of which are incorporated in their entirety by reference herein.

TECHNICAL FIELD

The present disclosure relates to the field of display technology, in particular to a mask plate and a method for manufacturing an array substrate.

BACKGROUND

For a Thin Film Transistor (TFT) liquid crystal panel, in order to narrow a bezel of the liquid crystal panel, a gate driver circuit is integrated into an array substrate of the liquid crystal panel by Gate On Array (GOA) technology to replace an external driver chip, so as to realize a display function of the liquid crystal panel. The array substrate generally includes a GOA region and a display region. At the GOA region, gate lines and a source/drain metal layer are connected to each other through a via-hole penetrating through a Gate Insulator (GI) layer. At the display region, a drain electrode of the TFT and a pixel electrode are connected to each other through a via-hole.

Generally, two mask plates are provided in the related art, i.e., a via-hole at the GOA region and a via-hole in the display region are formed by a GI mask plate and a VIA mask plate respectively. However, the production cost may increase when two mask plates are provided.

SUMMARY

An object of the present disclosure is to provide a mask plate and a method for manufacturing an array substrate, so as to overcome the above-mentioned drawback.

In one aspect, the present disclosure provides in some embodiments a mask plate, including a first region corresponding to a Gate On Array (GOA) region of an array substrate and a second region corresponding to a display region of the array substrate. The first region comprises at least one first aperture, the at least one first aperture is used to form a Gate Insulator (GI) via-hole penetrating through a gate insulating layer at the GOA region, and a gate line is exposed through the GI via-hole. The second region comprises at least one second aperture, the at least one second aperture is a half-tone mask aperture and is used to form a VIA via-hole at the display region, and a source/drain metal layer pattern is exposed through the VIA via-hole.

In another aspect, the present disclosure provides in some embodiments a method for manufacturing an array substrate using the above-mentioned mask plate, including steps of forming gate lines on a transparent substrate; forming a gate insulating layer on the transparent substrate with the gate lines; forming, by using the mask plate, at least one GI via-hole in a surface of the gate insulating layer at a GOA region by a patterning process, the at least one GI via-hole penetrating through the gate insulating layer so as to expose the gate lines; forming an active layer and a source/drain metal layer sequentially on the surface of the transparent substrate with the at least one GI via-hole, the gate line and the source/drain metal layer at the GOA region being connected directly to each other through the at least one GI via-hole; forming a protective layer on the transparent substrate with the active layer and the source/drain metal layer; and forming, by using the mask plate, at least one VIA via-hole in a surface of the protective layer at a display region by a patterning process, the at least one VIA via-hole penetrating through the protective layer so as to expose the source/drain metal layer.

According to the embodiments of the present disclosure, the mask plate includes at least one first aperture and at least one second aperture. The first aperture is used to form the GI via-hole at the GOA region, and the second aperture is used to form the VIA via-hole at the display region. That is, the first aperture for forming the GI via-hole at the GOA region and the second aperture for forming the VIA via-hole at the display region are provided in the same mask plate, and the two kinds of via-holes are formed by the same mask plate. As a result, it is able to reduce the production cost.

BRIEF DESCRIPTION OF THE DRAWINGS

In order to illustrate the technical solutions of the present disclosure in a clearer manner, the drawings desired for the present disclosure will be described hereinafter briefly. Obviously, the following drawings merely relate to some embodiments of the present disclosure, and based on these drawings, a person skilled in the art may obtain the other drawings without any creative effort.

DETAILED DESCRIPTION

In order to make the objects, the technical solutions and the advantages of the present disclosure more apparent, the present disclosure will be described hereinafter in details in conjunction with the embodiments and drawings.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Figure 1:
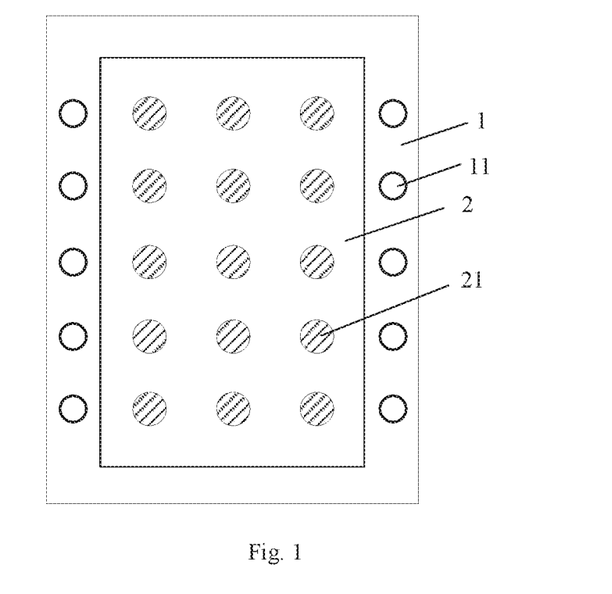
FIG. 1 is a schematic view showing a mask plate according to one embodiment of the present disclosure.

The present disclosure provides in some embodiments a mask plate. Referring to FIG. 1, the mask plate includes a first region 1 corresponding to a GOA region of an array substrate and a second region 2 corresponding to a display region of the array substrate.

The first region 1 includes at least one first aperture 11, and the at least one first aperture 11 is used to form a GI via-hole penetrating through a gate insulating layer at the GOA region, so as to expose a gate line. The second region 2 includes at least one second aperture 21, and the at least one second aperture 21 is a half-tone mask aperture and is used to form a VIA via-hole at the display region of the array substrate.

According to the embodiments of the present disclosure, the mask plate includes at least one first aperture and at least one second aperture. The first aperture is used to form the GI via-hole at the GOA region, and the second aperture is used to form the VIA via-hole at the display region. That is, the first aperture for forming the GI via-hole at the GOA region and the second aperture for forming the VIA via-hole at the display region are provided in the same mask plate, and the two kinds of via-holes are formed by the same mask plate. As a result, it is able to reduce the production cost.

It should be noted that, in some embodiments of the present disclosure, the half-tone mask aperture refers to an aperture through which light cannot pass completely. During the actual application, the half-tone mask may be realized, according to the practical need, by adding a filter structure in an aperture through which the light can pass. To be specific, the at least one second aperture 21 is arranged as the half-tone mask aperture, so as to prevent the gate insulating layer at the display region of the array substrate from being adversely affected when forming the GI via-hole at the GOA region by using the mask plate. In addition, in some embodiments of the present disclosure, the display region of the array substrate is a valid display region, i.e., a transparent region.

Figure 2:
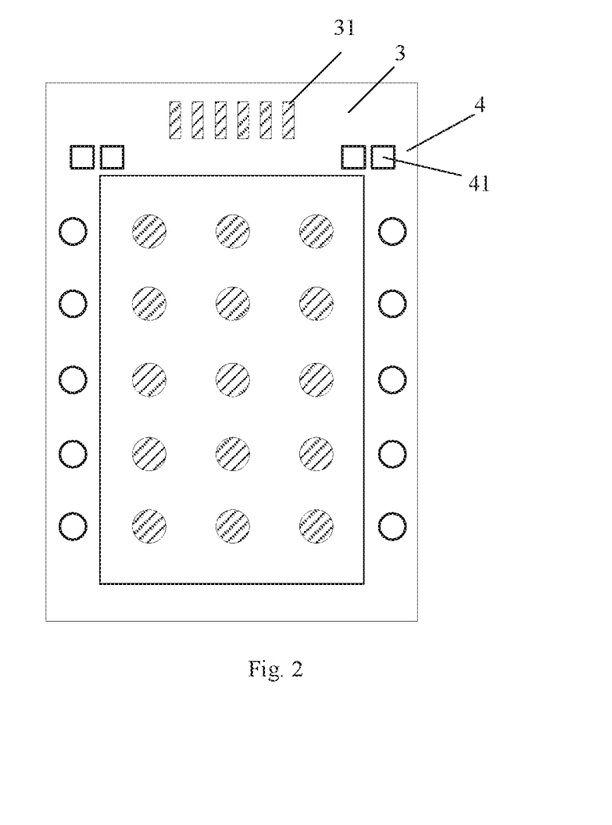
FIG. 2 is another schematic view showing the mask plate according to one embodiment of the present disclosure.

In some embodiments of the present disclosure, referring to FIG. 2, the mask plate further includes a third region 3 corresponding to an Integrated Circuit (IC) Pad region of the array substrate.

The third region 3 includes at least one third aperture 31, and the at least one third aperture 31 is a half-tone mask aperture and is used to form a VIA via-hole at the IC Pad region.

Besides the GI via-hole formed at the GOA region and the VIA via-hole formed at the display region, the VIA via-hole may also be formed at the IC Pad region. The GI via-hole at the GOA region is used to expose the gate lines, and the source/drain metal layer and the gate lines at the GOA region are connected to each other through the GI via-hole. The VIA via-hole at the display region is used to expose the source/drain metal layer, and a pixel electrode and a drain electrode of a TFT at the display region are connected to each other through the VIA via-hole. The VIA via-hole at the IC Pad region is also used to expose the source/drain metal layer. Hence, identical to the VIA via-hole at the display region, the third aperture for forming the VIA via-hole at the IC Pad region is also arranged as a half-tone mask aperture and provided in the same mask plate, so as to further reduce the production cost.

In some embodiments of the present disclosure, the mask plate further includes a fourth region 4 corresponding to a signal line region of the array substrate.

The fourth region includes at least one fourth aperture 41, and the at least one fourth aperture 41 is used to form a GI via-hole at the signal line region of the array substrate.

Besides the GI via-hole formed at the GOA region, the VIA via-hole formed at the display region and the VIA via-hole formed at the IC Pad region, the GI via-hole may be also formed at the signal line region to expose the gate lines. Hence, the fourth aperture for forming the GI via-hole at the signal line region may be also provided in the same mask plate, so as to further reduce the production cost.

It should be noted that, the at least one first aperture in the mask plate may be used to form not only the GI via-hole but also the other apertures at the GOA region, which is not particularly defined herein. Identically, the at least one second aperture in the mask plate may be used to form not only the VIA via-hole but also the other apertures at the display region, the at least one third aperture in the mask plate may be used to form not only the VIA via-hole but also the other apertures at the IC Pad region, and the at least one fourth aperture in the mask plate may be used to form not only the GI via-hole but also the other apertures at the signal line region, which is not particularly defined herein either.

The above optional technical solutions may be combined in any way to form the preferred embodiments of the present disclosure.

Figure 3:
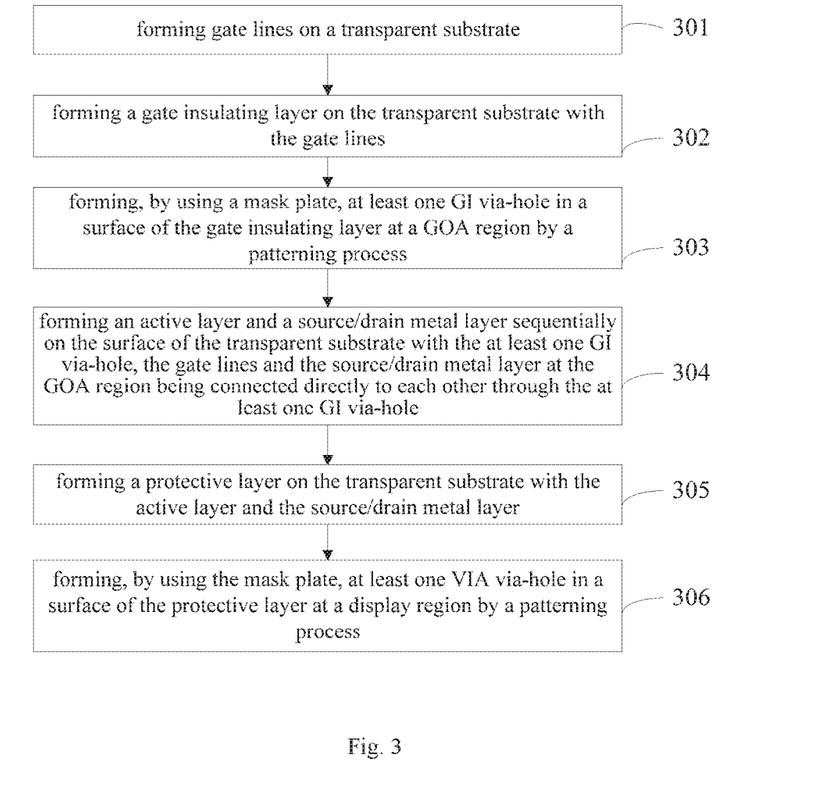
FIG. 3 is a flow chart of a method for manufacturing an array substrate according to one embodiment of the present disclosure.

The present disclosure further provides in some embodiments a method for manufacturing an array substrate using the above-mentioned mask plate. Referring to FIG. 3, the method includes the following steps.

Step 301: forming gate lines on a transparent substrate.

Step 302: forming a gate insulating layer on the transparent substrate with the gate lines.

Step 303: forming, by using the mask plate, at least one GI via-hole in a surface of the gate insulating layer at a GOA region by a patterning process, the at least one GI via-hole penetrating through the gate insulating layer so as to expose the gate lines.

Step 304: forming an active layer and a source/drain metal layer sequentially on the surface of the transparent substrate with the at least one GI via-hole, the gate lines and the source/drain metal layer at the GOA region being connected directly to each other through the at least one GI via-hole.

Data lines connected to source electrodes are formed while forming the source/drain metal layer. In other words, the step of forming the source/drain metal layer includes forming the source/drain metal layer including the data lines.

Step 305: forming a protective layer on the transparent substrate with the active layer and the source/drain metal layer.

Step 306: forming, by using the mask plate, at least one VIA via-hole in a surface of the protective layer at a display region by a patterning process, the at least one VIA via-hole penetrating through the protective layer so as to expose the source/drain metal layer.

According to the embodiments of the present disclosure, the at least one GI via-hole is formed through the gate insulating layer the GOA by a first patterning process, so as to expose the gate lines. Then, the active layer and the source/drain metal layer are formed on the gate line at the at least one GI via-hole, so as to enable the active layer to be directly connected to the source/drain metal layer. In addition, the at least one GI via-hole at the GOA region and the at least one VIA via-hole at the display region are formed using the same mask plate by two patterning processes, so as to reduce the production cost.

Figures 4, 5:
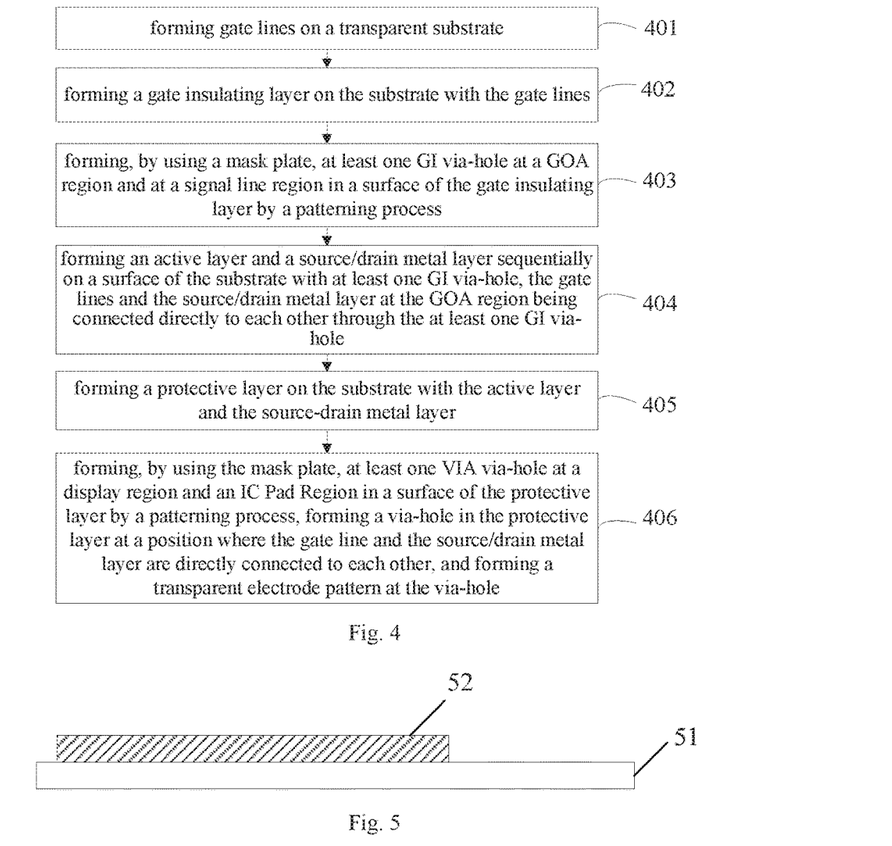
FIG. 4 is another flow chart of the method for manufacturing an array substrate according to one embodiment of the present disclosure.
FIG. 5 is a schematic view showing a substrate with gate lines according to one embodiment of the present disclosure.

The present disclosure further provides in some embodiments a method for manufacturing an array substrate using the above-mentioned mask plate. Referring to FIG. 4, the method includes the following steps.

Step 401: forming gate lines on a transparent substrate.

To be specific, a gate metal layer is formed on the transparent substrate, and the gate lines are formed on the gate metal layer by a patterning process.

The gate metal layer is used to form thereon the gate lines, and it may be formed on the transparent substrate by depositing, coating or sputtering. Of course, during the actual application, the gate metal layer may be formed on the transparent substrate in other ways, which are particularly defined herein.

In addition, the step of forming the gate lines on the gate metal layer by a patterning process may include: coating a photoresist onto a surface of the gate metal layer, exposing, by using the mask plate for forming the gate lines, the transparent substrate with the photoresist, developing, by using a developing solution, the exposed substrate, so as to form on the substrate a pattern corresponding to the mask plate for forming the gate lines; etching, by an etchant, the developed substrate: and removing the photoresist so as to form the gate lines.

It should be noted that, in some embodiments of the present disclosure, the method for forming the gate lines on the transparent substrate may refer to the method in the related art, which is not particularly defined herein.

Step 402: forming a gate insulating layer on the substrate with the gate lines.

The gate insulating layer is configured to protect the gate lines formed on the transparent substrate, and it may be formed on the substrate with the gate lines by depositing, coating or sputtering. Of course, during the actual application, the gate insulating layer may be formed in any other ways, which are not particularly defined herein.

Figure 6:
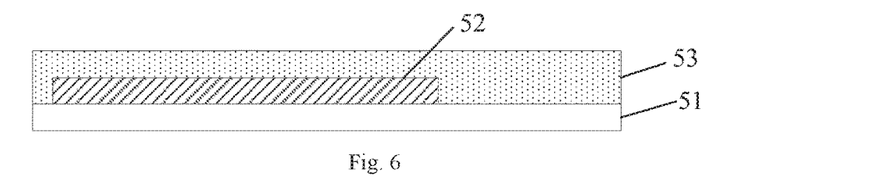
FIG. 6 is a schematic view showing the substrate with a gate insulating layer according to one embodiment of the present disclosure.

For example, FIG. 5 shows a structure of the transparent substrate on which the gate lines are formed. In FIG. 5, 51 represents the transparent substrate, and 52 represents the gate line. Referring to FIG. 6, a gate insulating layer 53 is formed on the substrate with the gate lines.

Step 403: forming, by using the above-mentioned mask plate, at least one GI via-hole in a surface of the gate insulating layer at a GOA region by a patterning process, the at least one GI via-hole penetrating through the gate insulating layer so as to expose the gate lines.

To be specific. Step 403 further includes: coating a photoresist onto the gate insulating layer; exposing, by using the mask plate, the substrate coated with the photoresist; and developing and etching the exposed substrate so as to from the at least one GI via-hole at the GOA region. A developing solution may be used to develop the exposed substrate, and an etchant may be used to etch the developed substrate.

As mentioned above, the first region of the mask plate includes at least one first aperture, and the second region of the mask plate includes at least one second aperture. Hence, when exposing the substrate coated with the photoresist by using the mask plate, the photoresist corresponding to the at least one first aperture may be exposed completely, while the photoresist corresponding to the at least one second aperture may be exposed partially in a thickness direction. Hence, when developing the exposed substrate using the developing solution, the photoresist corresponding to the at least one first aperture may be dissolved in the developing solution, and only a part of the photoresist corresponding to the at least one second aperture may be dissolved in the developing solution, with the unexposed photoresist being left on the substrate. In addition, generally the exposed photoresist has a smaller thickness, while the unexposed photoresist has a larger thickness, so it is able to prevent the at least one second aperture from being adversely affected when etching the developed substrate, thereby to form the at least one GI via-hole at the GOA region and the at least one VIA via-hole at the display region using the mask plate.

In some embodiments of the present disclosure, referring to FIG. 2, the mask plate includes not only the at least one first aperture for forming the GI via-hole at the GOA region but also the at least one fourth aperture for forming the GI via-hole at the signal line region. Hence, on the insulating layer, the at least one GI via-hole may be formed at the signal line region while forming the at least one GI via-hole at the GOA region using the above-mentioned mask plate by a patterning process. That is, the step of forming, by using the mask plate, the at least one GI via-hole in the surface of the gate insulating layer at the GOA region by a patterning process may include: forming, by using the mask plate, the at least one GI via-hole at the GOA region and the at least one GI via-hole at the signal line region in the surface of the gate insulating layer by a patterning process. In this way, it is able to shorten the time for manufacturing the array substrate, thereby to reduce the production cost.

It should be noted that, a process for forming the at least one GI via-hole at the signal line region is the same as that for forming the at least one GI via-hole at GOA region, and thus is not particularly defined herein.

Figure 7:
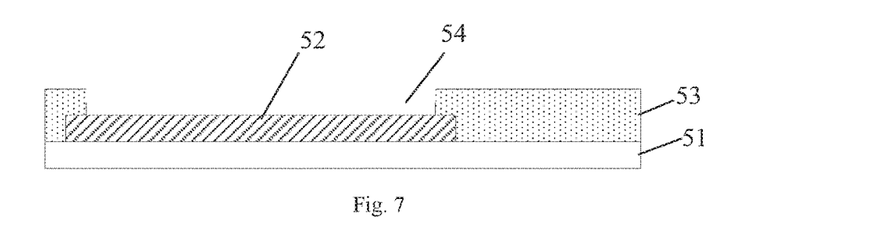
FIG. 7 is a schematic view showing the substrate with a GI via-hole at a GOA region according to one embodiment of the present disclosure.

On the gate insulating layer in FIG. 6, at least one GI via-hole 54 is formed at the GOA region by a patterning process using the mask plate, as shown in FIG. 7.

Step 404: forming an active layer and a source/drain metal layer sequentially on the surface of the transparent substrate with the at least one GI via-hole, the gate lines and the source/drain metal layer at the GOA region being connected directly to each other through the at least one GI via-hole.

The display region of the array substrate further includes the active layer, and the active layer is arranged on the gate insulating layer and under the source/drain metal layer, so it is required to form the active layer on the surface of the substrate with at least one GI via-hole. In addition, the GOA region of the array substrate does not include the active layer, so when forming the active layer on the surface of the substrate with at least one GI via-hole, the active layer may not be formed at a position corresponding to the at least one GI via-hole, and the active layer formed at the GOA region may be removed. Then, the source/drain metal layer is formed on the surface of the substrate with the active layer, and a source/drain metal layer pattern is formed on the source/drain metal layer by a patterning process. At the GOA region, the gate lines and the source/drain metal layer are directly connected to each other through the at least one GI via-hole, so as to prevent the occurrence of imperfect connection, thereby to improve the connection between the gate lines and the source/drain metal layer.

A process for forming the source/drain metal layer pattern on the source/drain metal layer is similar to the process for forming the gate lines on the gate metal layer in Step 401, and thus is not particularly defined herein. In addition, in some embodiments of the present disclosure, a method for forming the source/drain metal layer pattern on the substrate with the source/drain metal layer may refer to that known in the related art, which is not particularly defined herein.

The source/drain metal layer pattern includes data lines, and source electrodes and drain electrodes of the TFTs.

Figure 8:
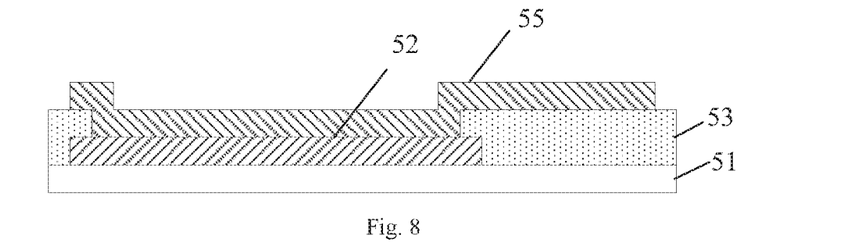
FIG. 8 is a schematic view showing the substrate with data lines according to one embodiment of the present disclosure.

Referring to FIG. 8, after forming the active layer and a source/drain metal layer pattern 55 sequentially on the surface of the transparent substrate with at least one GI via-hole 54, the gate lines and the source/drain metal layer pattern at the GOA region are connected directly to each other through the at least one GI via-hole 54 in FIG. 8;

Step 405: forming a protective layer on the substrate with the active layer and the source/drain metal layer pattern.

The protective layer is configured to protect the source/drain metal layer pattern formed on the substrate, and it may be formed on the substrate with the source/drain metal layer pattern by depositing, coating or sputtering. Of course, during the actual application, the protective layer may be formed in any other ways, which are not particularly defined herein.

Figure 9:
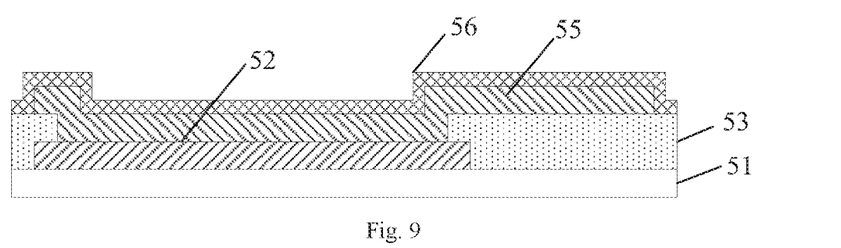
FIG. 9 is a schematic view showing the substrate with a protective layer according to one embodiment of the present disclosure.

The protective layer 56 is formed on the substrate with the source/drain metal layer pattern 55, as shown in FIG. 9.

Step 406: forming, by using the mask plate, at least one VIA via-hole in a surface of the protective layer at a display region by a patterning process, the at least one VIA via-hole penetrating through the protective layer so as to expose the source/drain metal layer.

To be specific, the step of forming, by using the mask plate, the at least one VIA via-hole in the surface of the protective layer at the display region by a patterning process includes: coating a photoresist onto the protective layer; exposing, by using the mask plate, the substrate coated with the photoresist; and developing, ashing and etching the exposed substrate so as to form the at least one VIA via-hole at the display region. The exposed substrate may be developed by a developing solution, and the developed substrate may be etched by an etchant.

As mentioned above, the first region of the mask plate includes at least one first aperture, and the second region of the mask plate includes at least one second aperture. Hence, when exposing the substrate coated with the photoresist by using the mask plate, the photoresist corresponding to the at least one first aperture may be exposed completely, while the photoresist corresponding to the at least one second aperture may be exposed partially in a thickness direction. Hence, when developing the exposed substrate using the developing solution, the photoresist corresponding to the at least one first aperture may be dissolved in the developing solution, and only a part of the photoresist corresponding to the at least one second aperture may be dissolved in the developing solution, with the unexposed photoresist being left on the substrate. Hence, the unexposed photoresist corresponding to the at least one second aperture may be removed by ashing, and then the substrate may be etched by an etching process so as to form the at least one VIA via-hole at the display region.

The at least one second aperture is a half-tone mask aperture. Hence, after the developing process, the photoresist corresponding to the at least one second aperture may be removed by the ashing process, so as to form the at least one VIA via-hole at the display region.

When the exposed substrate is developed using the developing solution, the photoresist corresponding to the at least one first aperture may be dissolved in the developing solution. Hence, when the substrate is etched using the etchant, the protective layer at a position corresponding to the at least one first aperture may also be etched through. When the at least one VIA via-hole is formed in the surface of the protective layer at the display region by a patterning process using the mask plate, a via-hole is further formed in the protective layer at a position where the gate lines and the source/drain metal layer pattern are directly connected to each other. After then, at such via-hole formed in the protective layer at the position where the gate lines and the source/drain metal layer pattern are directly connected to each other, a transparent electrode pattern is formed on the source/drain metal layer pattern.

The source/drain metal layer is configured to output a signal at the GOA region, so after the transparent electrode pattern is formed on the source/drain metal layer pattern at the via-hole, a signal from the source/drain metal layer pattern may be tested via the transparent electrode pattern, so as to ensure the normal signal output at the GOA region.

It should be noted that, in some embodiments of the present disclosures, the transparent electrode may be an Indium Tin Oxide (ITO) electrode. Of course, any other electrodes may also be used, and they are not particularly defined herein.

Figure 10:
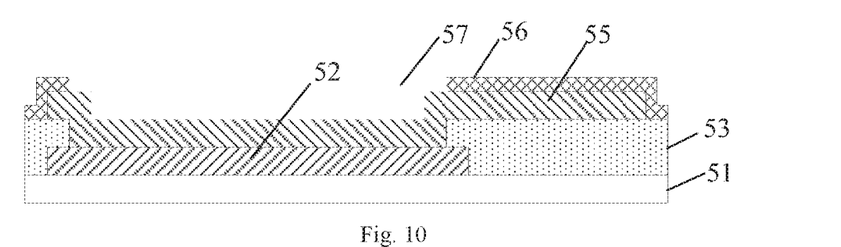
FIG. 10 is a schematic view showing a substrate with a via-hole in the protective layer at the GOA region according to one embodiment of the present disclosure.
Figure 11:
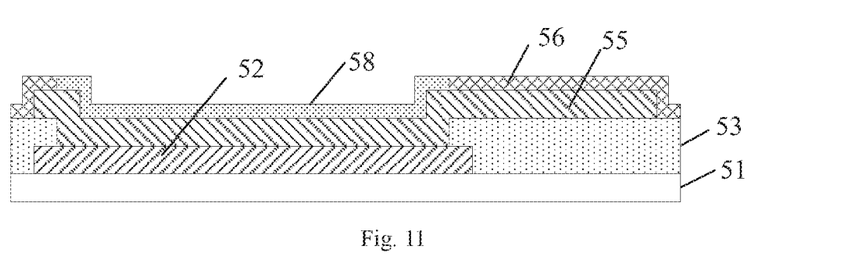
FIG. 11 is a schematic view showing the substrate with an Indium Tin Oxide (ITO) pattern at the via-hole in a protective layer at the GOA region according to one embodiment of the present disclosure.

Referring to FIG. 10, on the substrate with the protective layer 56, a via-hole 57 is formed in the protective layer 56 at a position where the gate lines and the source/drain metal layer pattern are directly connected to each other. The transparent electrode pattern 58 is formed on the source/drain metal layer pattern at the via-hole 57, as shown in FIG. 11.

In some embodiments of the present disclosure, the mask plate includes not only the at least one second aperture for forming the VIA via-hole at the display region but also the at least one third aperture for forming the VIA via-hole at the IC Pad region. Hence, on the protective layer, the at least one VIA via-hole is formed at the IC Pad region while forming the at least one VIA via-hole at the display region by a patterning process using the mask plate. That is, the step of forming, by using the mask plate, the at least one VIA via-hole in the surface of the protective layer at the display region by a patterning process includes: forming, by using the mask plate, the at least one VIA via-hole at the display region and the at least one VIA via-hole at the IC Pad region in the surface of the protective layer by a patterning process. In this way, it is able to reduce of the time desired for manufacturing the array substrate, thereby to reduce the production cost.

It should be noted that, a process for forming the at least one VIA via-hole at the IC Pad region is the same as that for forming the at least one VIA via-hole at display region mentioned hereinbefore, and thus is not particularly defined herein.

According to the embodiments of the present disclosure, the at least one GI via-hole is formed through the gate insulating layer the GOA by a first patterning process, so as to expose the gate lines. Then, the active layer and the source/drain metal layer are formed on the gate lines at the at least one GI via-hole, so as to enable the active layer to be directly connected to the source/drain metal layer. In addition, the at least one GI via-hole at the GOA region and the at least one VIA via-hole at the display region are formed using the same mask plate by two patterning processes, so as to reduce the production cost.

The above are merely the preferred embodiments of the present disclosure. A person skilled in the art may make further modifications and improvements without departing from the principle of the present disclosure, and these modifications and improvements shall also fall within the scope of the present disclosure.

What is claimed is:

1. A mask plate, comprising a first region corresponding to a Gate On Array (GOA) region of an array substrate and a second region corresponding to a display region of the array substrate;
    the first region comprises at least one first aperture, the at least one first aperture is used to form a Gate Insulator (GI) via-hole penetrating through a gate insulating layer at the GOA region, and a gate line is exposed through the GI via-hole;
    the second region comprises at least one second aperture, the at least one second aperture is a half-tone mask aperture and is used to form a VIA via-hole at the display region, and a source/drain metal layer pattern is exposed through the VIA via-hole; and
    a third region corresponding to an Integrated Circuit (IC) Pad region of the array substrate,
    wherein the third region comprises at least one third aperture, and the at least one third aperture is a half-tone mask aperture and is used to form a VIA via-hole at the IC Pad region of the array substrate.

2. The mask plate according to claim 1, further comprising a fourth region corresponding to a signal line region of the array substrate; wherein
    the fourth region comprises at least one fourth aperture, and the at least one fourth aperture is used to form a GI via-hole at the signal line region of the array substrate.

3. A method for manufacturing an array substrate using a mask plate, wherein the mask plate comprises a first region corresponding to a Gate On Array (GOA) region of an array substrate, a second region corresponding to a display region of the array substrate; and a third region corresponding to an Integrated Circuit (C) Pad region of the array substrate,
    the first region comprises at least one first aperture, the at least one first aperture is used to form a Gate Insulator (GI) via-hole penetrating through a gate insulating layer at the GOA region, and a gate line is exposed through the GI via-hole;
    the second region comprises at least one second aperture, the at least one second aperture is a half-tone mask aperture and is used to form a VIA via-hole at the display region, and a source/drain metal layer pattern is exposed through the VIA via-hole; and
    the third region comprises at least one third aperture, and the at least one third aperture is a half-tone mask aperture and is used to form a VIA via-hole at the IC Pad region of the array substrate,
    the method comprising steps of:
    forming gate lines on a transparent substrate;
    forming a gate insulating layer on the transparent substrate with the gate lines;
    forming, by using the mask plate, at least one GI via-hole in a surface of the gate insulating layer at a GOA region by a patterning process, the at least one GI via-hole penetrating through the gate insulating layer so as to expose the gate lines;
    forming an active layer and a source/drain metal layer sequentially on the surface of the transparent substrate with the at least one GI via-hole, the gate lines and the source/drain metal layer at the GOA region being connected directly to each other through the at least one GI via-hole;
    forming a protective layer on the transparent substrate with the active layer and the source/drain metal layer; and
    forming, by using the mask plate, at least one VIA via-hole in a surface of the protective layer at a display region by a patterning process, the at least one VIA via-hole penetrating through the protective layer so as to expose the source/drain metal layer.

4. The method according to claim 3, wherein the step of forming, by using the mask plate, the at least one GI via-hole in the surface of the gate insulating layer at the GOA region by a patterning process comprises:
    coating a photoresist onto the gate insulating layer;
    exposing, by using the mask plate, the substrate coated with the photoresist; and
    developing and etching the exposed substrate so as to form the at least one GI via-hole at the GOA region.

5. The method according to claim 3, wherein the step of forming, by using the mask plate, the at least one GI via-hole in the surface of the gate insulating layer at the GOA region by a patterning process further comprises:
    forming, by using the mask plate, the at least one GI via-hole at the GOA region and at least one GI via-hole at a signal line region in the surface of the gate insulating layer by a patterning process.

6. The method according to claim 3, wherein the step of forming, by using the mask plate, the at least one VIA via-hole in the surface of the protective layer at the display region by a patterning process comprises:
    coating a photoresist onto the protective layer;
    exposing, by using the mask plate, the substrate coated with the photoresist; and
    developing, ashing and etching the exposed substrate so as to form the at least one VIA via-hole at the display region.

7. The method according to claim 3, wherein the step of forming, by using the mask plate, the at least one VIA via-hole in the surface of the protective layer at the display region by a patterning process further comprises:
    forming, by using the mask plate, the at least one VIA via-hole at the display region and at least one VIA via-hole at an Integrated Circuit (IC) Pad region in the surface of the protective layer by a patterning process.

8. The method according to claim 3, wherein when the at least one VIA via-hole is formed at the display region of the array substrate by a patterning process using the mask plate in the surface of the protective layer, a via-hole is further formed in the protective layer at a position where the gate lines and the source/drain metal layer are directly connected to each other; and
    after the at least one VIA via-hole is formed at the display region of the array substrate by a patterning process using the mask plate in the surface of the protective layer, a transparent electrode pattern is formed on a surface of the source/drain metal layer at the via-hole formed in the protective layer at the position where the gate lines and the source/drain metal layer are directly connected to each other.

9. The mask plate according to claim 1, further comprising a fourth region corresponding to a signal line region of the array substrate; wherein
    the fourth region comprises at least one fourth aperture, and the at least one fourth aperture is used to form a GI via-hole at the signal line region of the array substrate.

10. The method according to claim 4, wherein the step of forming, by using the mask plate, the at least one VIA via-hole in the surface of the protective layer at the display region by a patterning process further comprises:

forming, by using the mask plate, the at least one VIA via-hole at the display region and at least one VIA via-hole at an IC Pad region in the surface of the protective layer by a patterning process.

11. The method according to claim 5, wherein the step of forming, by using the mask plate, the at least one VIA via-hole in the surface of the protective layer at the display region by a patterning process further comprises:

forming, by using the mask plate, the at least one VIA via-hole at the display region and at least one VIA via-hole at an IC Pad region in the surface of the protective layer by a patterning process.

12. The method according to claim 6, wherein the step of forming, by using the mask plate, the at least one VIA via-hole in the surface of the protective layer at the display region by a patterning process further comprises:

forming, by using the mask plate, the at least one VIA via-hole at the display region and at least one VIA via-hole at an IC Pad region in the surface of the protective layer by a patterning process.

\* \* \* \* \*